United States Patent [19]

Inoue

[11] 4,334,125
[45] Jun. 8, 1982

[54] STEREO DEMODULATOR CIRCUIT

[75] Inventor: Shigeki Inoue, Toyokawa, Japan

[73] Assignee: Hitachi, Ltd., Tokyo, Japan

[21] Appl. No.: 118,974

[22] Filed: Feb. 6, 1980

[30] Foreign Application Priority Data

Feb. 13, 1979 [JP] Japan .................................. 54/14230

[51] Int. Cl.³ .............................................. H04H 5/00
[52] U.S. Cl. .................................. 179/1 GE; 329/50; 329/167
[58] Field of Search .......... 179/1 GE, 1 GD; 329/50, 329/167

[56] References Cited

U.S. PATENT DOCUMENTS

| | | | |
|---|---|---|---|
| 3,965,302 | 6/1976 | Kurata | 179/1 GE |
| 3,980,832 | 9/1976 | Nakamura et al. | 179/1 GE |
| 4,037,055 | 7/1977 | Sato et al. | 179/1 GE |
| 4,056,685 | 11/1977 | Burgyan | 179/1 GE |

Primary Examiner—Douglas W. Olms
Attorney, Agent, or Firm—Craig and Antonelli

[57] ABSTRACT

In a stereo demodulator circuit, there is provided a phase-locked loop in which a comparison signal is produced by frequency-dividing an oscillation signal of an oscillator, and the phase of the comparison signal is compared with the phase of the pilot signal to phase-lock the phase of the oscillation signal and the phase of the pilot signal. The output signal of the oscillator is frequency-divided to produce a first switching signal. The first switching signal and a composite signal are supplied to a first decoder at which left and right channel signals are separated. The output of the oscillator is also frequency-divided to produce a second switching signal having a frequency which is three times the sub-carrier frequency. The composite signal and the second switching signal are supplied to a second decoder at which the left and right channel signals are separated. Outputs of the first and second decoders are added to eliminate a beat signal which results from the third harmonic of the sub-carrier signal and an unwanted signal contained in the composite signal.

4 Claims, 3 Drawing Figures

STEREO DEMODULATOR CIRCUIT

This invention relates to stereo demodulator circuits in which a stereophonic composite signal is demodulated to reproduce left and right channel signals and more particularly to a stereo demodulator circuit adapted to receive and demodulate an FM stereo signal, which stereo signal is generated by frequency-modulating the carrier signal with left and right channel signals in stereophonic relationship and is transmitted, for reproducing the left and right channel signals.

In the FM multiplex broadcasting system wherein left and right channel signals on a single carrier signal are transmitted, as well known in the art, the main carrier is frequency-modulated with a composite signal and is then transmitted, the composite signal containing a main signal representative of a sum signal L+R of a left channel signal L and a right channel signal R, a sub-signal originating from the carrier inhibiting AM modulation of the 38 KHz sub-carrier with a difference signal L−R, and the pilot signal of 19 KHz which is half the frequency of 38 KHz of the sub-carrier.

Today, there is a wide-spread trend to incorporate the demodulator for the composite signal with a phase-locked loop (hereinafter simply referred to as PLL) which can provide a stable frequency of the sub-carrier and ensure versatile performances.

Such a PLL comprises a voltage-controlled oscillator whose oscillation frequency is controlled by an external control voltage, a first frequency divider connected to the output terminal of the voltage-controlled oscillator, for dividing frequency of the oscillator output signal, a second frequency divider connected to the output terminal of the first frequency divider, for further dividing frequency of the first frequency divider output signal, a phase comparator having a pair of input terminals and one output terminal, with one of the paired input terminals supplied with the pilot signal contained in a stereophonic composite signal and the other input terminal supplied with the output signal of the second frequency divider, and comparing the phase of the pilot signal with the phase of the second frequency divider output signal to produce on the output terminal an output signal whose amplitude corresponds to a phase difference between the two input signals, a low-pass filter connected to the output terminal of the phase comparator, for eliminating high frequency components contained in the output signal of the phase comparator, and a DC amplifier which amplifies the output signal of the low-pass filter and which supplies its output voltage, as the external control voltage, to the voltage-controlled oscillator. Thus, the voltage-controlled oscillator is controlled by the output voltage of the phase comparator. In particular, the oscillation frequency and phase of the voltage-controlled oscillator are controlled such that the phase of the second frequency divider output signal and the phase of the pilot signal are in phase, to ensure that the oscillation frequency of the voltage-controlled oscillator is phase-locked with the pilot signal. When the free-running frequency of the voltage-controlled oscillator is selected to be 76 KHz and the frequency division ratio of the first and second frequency dividers is selected to be ½, the output signal of the first frequency divider is at 38 KHz and the output signal of the second frequency divider is at 19 KHz. Each of the paired input terminals of the phase comparator is then supplied with a signal of substantially the same frequency and phases of the two input signals are compared. Since the 38 KHz output signal of the first frequency divider is identical with the frequency of sub-carrier contained in the stereophonic composite signal, the output signal of the first frequency divider is supplied to a decoder and used as a switching signal of the decoder for separation and reproduction of the left and right channel signals.

If the input signal to the stereo demodulator circuit had a pure composite signal, substantially no serious problems would would exist for such a demodulator of the PLL type. Actually, however, the frequency of a station which is desired for reception is often close to a signal frequency of another station or the inter-modulation of these signal frequencies often generates an unwanted spectrum near the frequency of the desired station.

Take two signals of amplitudes D and U and frequencies $f_1$ and $f_2$ (angular frequencies $\omega_1$ and $\omega_2$), for example. When an FM receiver set receives these signals, they are added in vector and a resultant vector undergoes phase modulation in terms of a phase difference $\psi$ between them, that is, $\psi = (\omega_1 - \omega_2)t$. If the FM receiver set is tuned to one frequency $f_1$ for reception thereof, there occur, at the output terminal of an FM detector, an output as a result of demodulation of the one frequency $f_1$ and an output which is proportional to the angular frequency difference $\omega_1 - \omega_2$ between the two input signals.

It is now assumed that two stations are allotted with a separation of 200 KHz and the maximum frequency deviation is 75 KHz. Then, the frequency separation ranges from 50 KHz to 350 KHz and there occur, at the input terminal of the stereo demodulator connected to the output of the FM detector, a composite signal containing a sum signal of 50 Hz to 15 KHz, the pilot signal of 19 KHz and a difference signal of 23 KHz to 53 KHz and an additional, unwanted signal prevailing in a band of 50 KHz to 350 KHz. The unwanted signal interferes with harmonics of the sub-carrier to creat a beat which is of an audio frequency, thereby leading to reception interference.

More particularly, when the 38 KHz switching signal supplied to the decoder of the stereo demodulator circuit takes the form of a rectangular wave, this switching signal contains many components of harmonics in addition to the 38 KHz fundamental wave component. Odd harmonics components interfere with the unwanted signal to create the beat which causes uncomfortable noises. Especially, the third harmonic is serious. Conventionally, a beat cut-off filter or a low-pass filter called a anti-birdy filter is inserted in the composite signal line to lower the level of the unwanted spectrum and reduce the beat. This conventional approach is unsatisfactory since frequency characteristics of the beat cut-off filter or the anti-birdy filter affect the separation of the left and right channel signals and frequency characteristics of the demodulated output.

The adverse phenomenon set forth above takes place when frequencies of two stations are close to each other, the frequency of a desired station and the frequency of another station are intermodulated so that an apparent frequency of the desired station falls in the proximity of the frequency of another station, and the receiver set is interiorly provided with an oscillator.

An object of this invention is therefore to provide an FM stereo demodulator circuit which can reduce the beat output without affecting frequency characteristics of the demodulated output.

According to this invention, the oscillation frequency of a voltage-controlled oscillator is set to be N times (N being integer which is not less than 3) the frequency of the sub-carrier, a switching signal is produced in addition to the sub-carrier, which switching signal has the fundamental wave corresponding to a harmonic of the sub-carrier, and an output signal as a result of switching a composite signal with the sub-carrier and an output signal as a result of switching the composite signal with the switching signal are added to or subtracted from each other to thereby reduce a beat output.

Other objects, features and advantages of this invention will become apparent from the following detailed description of preferred embodiments thereof taken in conjunction with the accompanying drawings, in which.

Figure 1:
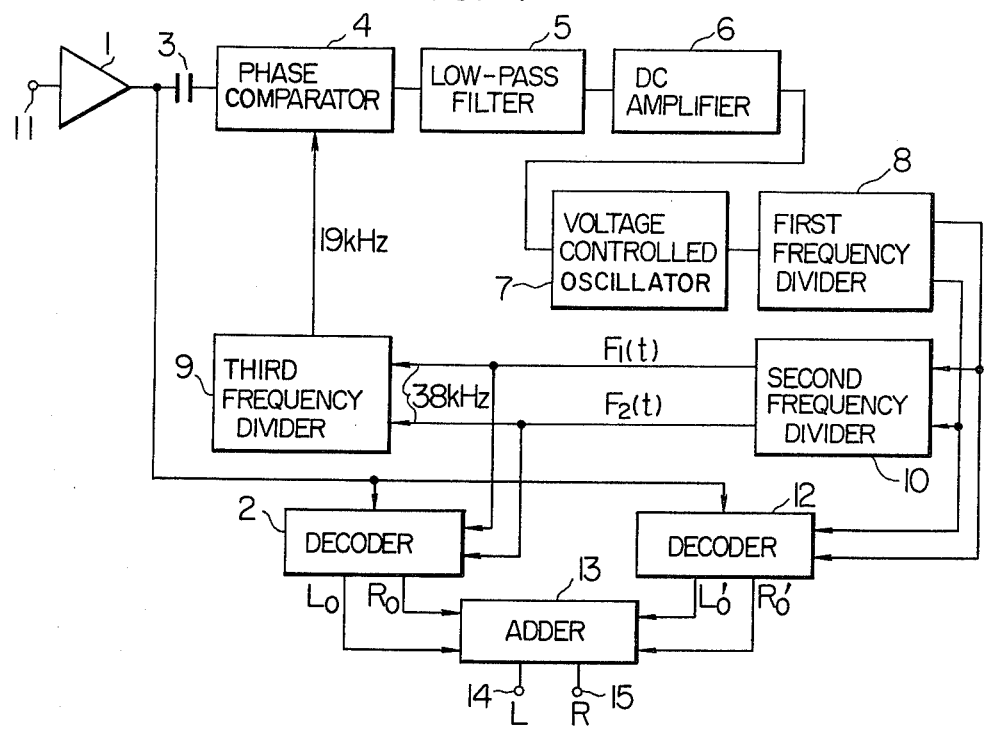
FIG. 1 is a block diagram to show one embodiment of a stereo demodulator circuit according to the invention.

Referring now to FIG. 1, there is shown a preferred embodiment of a stereo demodulator circuit according to the invention. An input terminal 11 of an amplifier 1 is supplied with a detected output of an FM receiver set, i.e. a composite signal. The composite signal is then amplified at the amplifier 1. An output terminal of the amplifier 1 is connected to one of paired input terminals of a phase comparator 4 via a capacitor 3. The other input terminal of the phase comparator 4 is connected to an output terminal of a third frequency divider 9. An output terminal of the phase comparator 4 is connected to an input terminal of a low-pass filter 5 having an output terminal connected to an input terminal of a DC amplifier 6. A voltage-controlled oscillator as designated by reference numeral 7 has an input terminal connected to an output terminal of the DC amplifier 6 and an output terminal connected to an input terminal of a first frequency divider 8. A set of output terminals of the first frequency divider 8 is connected to a set of input terminals of a second frequency divider 10 and also to a set of input terminals of a second decoder 12. A set of output terminals of the second frequency divider 10 is connected to a set of input terminals of the third frequency divider 9 and also to a set of input terminals of a first decoder 2. The other input terminal of each of the first and second decoder 2 and 12 is connected to the output terminal of the amplifier 1. The first decoder has a set of output terminals connected to one set of input terminals of an adder 13 and the second decoder has a set of output terminals connected to the other set of input terminals of the adder 13.

With this circuit construction, the voltage-controlled oscillator 7 oscillates at a frequency which is N times (N being integer not less than 3) the frequency of sub-carrier contained in the composite signal and in a particular case as exemplified herein, at 228 KHz which is six times the sub-carrier frequency. The output signal of the oscillator is supplied to the first frequency divider 8. The first frequency divider 8 has a frequency division ratio of ½ and divides the output signal frequency of the voltage-controlled oscillator by 2 to produce at its output terminal a signal of 114 KHz which is supplied to the second frequency divider 10. This divider 10 has a frequency division ratio of ⅓ and divides the output signal frequency of the divider 8 by 2 to produce a signal of 38 KHz. The output signal of the second frequency divider 10 is supplied to the third frequency divider 9 at which it is further divided. Since the third frequency divider 9 has a frequency division ratio of ½, the frequency of output signal of the second frequency divider 10 is divided by 2 at the divider 9 and an output signal obtained therefrom has a frequency of 19 KHz. This output signal is supplied to the other input terminal of the phase comparator 4. The phase comparator 4 receiving at one terminal the composite signal amplified at the amplifier 1 and fed via the capacitor 3 compares the phase of the 19 KHz pilot signal contained in the composite signal with the phase of the signal fed from the third frequency divider 9 to produce an error voltage having an amplitude which corresponds to a phase difference between the two input signals. The error voltage is supplied to the low-pass filter 5 at which high frequency components contained in the error voltage are eliminated, and only a DC component is supplied to the DC amplifier 6. The error voltage thus amplified at the DC amplifier 6 is supplied to the voltage-controlled oscillator 7, which controls its oscillation frequency and phase such that the error voltage at the phase comparator 4 is reduced. In this manner, oscillation of the voltage-controlled oscillator 7 can be phase-locked with the pilot signal contained in the composite signal and the 38 KHz sub-carrier signal phase-locked with the pilot signal can be reproduced from the second frequency divider 10.

The first decoder 2 is supplied with the composite signal amplified at the amplifier 1 and the sub-carrier signal from the second frequency divider 10. The composite signal is then switched with the sub-carrier signal to effect separation between left and right channel signals. The output signal of the second frequency divider 10 takes the form of a rectangular wave with a duty ratio of 50% and it is written by the following components $F_1(t)$ and $F_2(t)$:

$$F_1(t) = \tfrac{1}{2} + \frac{2}{\pi} \cos\omega t - \frac{2}{3\pi} \cos3\omega t + \frac{2}{5\pi} \cos5\omega t \quad (1)$$

$$F_2(t) = \tfrac{1}{2} - \frac{2}{\pi} \cos\omega t + \frac{2}{3\pi} \cos3\omega t - \frac{2}{5\pi} \cos5\omega t \quad (2)$$

where $\omega = 2\pi \times 38$ KHz.

The components $F_1(t)$ and $F_2(t)$ of the output signal from the second frequency divider 10 as shown in equations (1) and (2) are supplied to the first decoder 2 and thereat multiplied by the composite signal. The component $F_1(t)$ of equation (1) is multiplied by the composite signal to derive therefrom an audio component as one output $e_{Lo}$ of the first decoder which is:

$$e_{Lo} = \left\{ (L + R) + (L - R) \cos\omega t + p \cos\tfrac{\omega}{2} t \right\} \times$$

$$\left( \tfrac{1}{2} + \frac{2}{\pi} \cos\omega t - \frac{2}{3\pi} \cos3\omega t + \frac{2}{5\pi} \cos5\omega t \right)$$

$$= \frac{L+R}{2} + \frac{L-R}{\pi} = \left( \tfrac{1}{2} + \frac{1}{\pi} \right) L + \left( \tfrac{1}{2} - \frac{1}{\pi} \right) R \quad (3)$$

where p represents an amplitude of a pilot signal.

Similarly, the component $F_2(t)$ of equation (2) is multiplied by the composite signal to derive therefrom an audio component as the other output $e_{Ro}$ which is:

$$e_{Ro} = \frac{L+R}{2} - \frac{L-R}{\pi} = \left(\frac{1}{2} + \frac{1}{\pi}\right) R + \left(\frac{1}{2} - \frac{1}{\pi}\right) L \quad (4)$$

An output signal $e_L$ as a result of subtracting a signal $\alpha \cdot e_{Ro}$ which is the product of the other output signal $e_{Ro}$ and a coefficient $\alpha$ from the one output signal $e_{Lo}$ is written as, $$e_L = e_{Lo} - \alpha e_{Ro} \quad (5)$$

$$= \left\{\left(\frac{1}{2} + \frac{1}{\pi}\right) - \alpha\left(\frac{1}{2} - \frac{1}{\pi}\right)\right\} L +$$

$$\left\{\left(\frac{1}{2} - \frac{1}{\pi}\right) - \alpha\left(\frac{1}{2} + \frac{1}{\pi}\right)\right\} R$$

Let $\alpha$ be $\frac{\pi - 2}{\pi + 2}$, then, $$e_L = \left\{\left(\frac{1}{2} + \frac{1}{\pi}\right) - \frac{\pi - 2}{\pi + 2}\left(\frac{1}{2} - \frac{1}{\pi}\right)\right\} L \quad (6)$$

In this manner, the left channel signal can be separated from the composite signal.

Similarlity holds true for substraction of a signal $\alpha \cdot e_{Lo}$ from the other output signal $e_{Ro}$ to separate the right signal from the composite signal.

The first decoder 2 ensures in this way the demodulation of the composite signal and the separation of the left and right channel signals. However, if an unwanted signal in addition to the composite signal is contained in the input signal to the amplifier 1, the unwanted signal interferes with the output signal of the second frequency divider 10 to create a beat which prevails in the output signal from the first decoder 2. In the event that the beat has an audio frequency, this audio frequency signal is undesirably reproduced from a loudspeaker. The components $F_1(t)$ and $F_2(t)$ of the output signal of the second frequency divider 10 contain, as shown in equations (1) and (2), the fundamental wave component of 38 KHz and the third harmonic and fifth harmonic of the fundamental wave component. Consequently, when the unwanted signal is multiplied by the third or fifth harmonic at the first decoder, the beat signal of audio frequency takes place. For example, if an unwanted signal around the third harmonic of the sub-carrier signal is contained, in addition to the composite signal, in the input signal to the amplifier 1, the signal to be supplied to the first decoder 2 is:

$$(L + R) + (L - R)\cos\omega t + p\cos\frac{\omega t}{2} \quad (7)$$

$$+ X\cos(3\omega t \pm \omega pt)$$

where X represents the amplitude of the unwanted signal and $\omega p$ a difference angular frequency between the unwanted signal frequency and a frequency which is three times the sub-carrier frequency.

Thus, when the signal as shown in equation (7) is multiplied by the component $F_1(t)$ of equation (1), the output signal $e_{Lo}$ of the decoder 2 is:

$$e_{Lo} = \left\{(L + R) + (L - R)\cos\omega t + p\cos\frac{\omega}{2}t\right.$$

$$\left. + X\cos(3\omega t \pm \omega pt)\right\} \times \left(\frac{1}{2} + \frac{2}{\pi}\cos\omega t - \frac{2}{3\pi}\cos 3\omega t\right)$$

$$= \frac{L+R}{2} + \frac{L-R}{\pi} + \frac{X}{3\pi}\cos\omega t \quad (8)$$

In equation (8), $X/3\pi \cos \omega t$ stands for the unwanted signal contained in the output signal of the decoder 2.

The stereo demodulator circuit as shown in FIG. 1 comprises the second decoder 12, whereby the output signal of the first decoder is supplied to the one set of input terminals of the adder 13 and the output signal of the second decoder to the other set of input terminals. The second decoder 12 having, like the first decoder 2, the one set of input terminals supplied with the output signal of the first frequency divider and the other input terminal supplied with the output signal of the amplifier 1 multiplies, as in the first decoder 2, the composite signal by the output signal of the first frequency divider 8. If the signal to be supplied to the other input terminal of the second decoder 12 contains, in addition to the composite signal, the unwanted signal as shown in equation (7), the output signal $e_{Lo}'$ is:

$$e_{L'o} = \left\{(L + R) + (L - R)\cos\omega t + p\cos\frac{\omega}{2}t\right.$$

$$\left. + X\cos(3\omega t \pm \omega pt)\right\} \times \left(\frac{1}{2} + \frac{2}{\pi}\cos 3\omega t - \frac{2}{3\pi}\cos 9\omega t + \right)$$

$$= \frac{L+R}{2} + \frac{X}{\pi}\cos\omega pt \quad (9)$$

The output signal of the first decoder 2 is supplied to the one set of input terminals of the adder 13 and the output signal of the second decoder 12 to the other set and they are added to or subtracted from each other. When one output signal $e_{Lo}$ of the first decoder 2 and one output signal $e_{L'o}$ of the second decoder 12 are added at a ratio of one to $\alpha$, one output L of the adder 13 is:

$$L = e_{Lo} + \alpha e_{L'o} \quad (10)$$

$$= \frac{(1 + \alpha)(L + R)}{2} + \frac{L - R}{\pi} + \left(\frac{1}{3\pi} - \frac{\alpha}{\pi}\right) X\cos\omega pt$$

Let $\alpha$ be $\frac{1}{3}$, then the coefficient of $X \cos \omega pt$ is zero and equation (10) reduces to, $$L = e_{Lo} + \frac{1}{3} e_{L'o} \quad (11)$$

$$= \frac{(1 + \frac{1}{3})(L + R)}{2} + \frac{L - R}{\pi}$$

The other output signal of the first decoder 2 and the other output signal of the second decoder 12 are added at the adder 13 in a similar manner to produce the other output R from the adder 13, which output is:

$$R = e_{Ro} + \tfrac{1}{3} e_{R'o} \quad (12)$$

$$= \frac{(1 + \tfrac{1}{3})(L + R)}{2} + \frac{L - R}{\pi}$$

As will be seen from the foregoing description, it is possible to eliminate the beat signal stemming from the unwanted signal and sub-carrier signal by adding the output signals of the first and second decoders 2 and 12 at the adder 13. The subtraction between the two input signals of the adder 13 at a suitable ratio, as in equations (5) and (6), ensures separation of the left and right channel signals.

Figure 2:
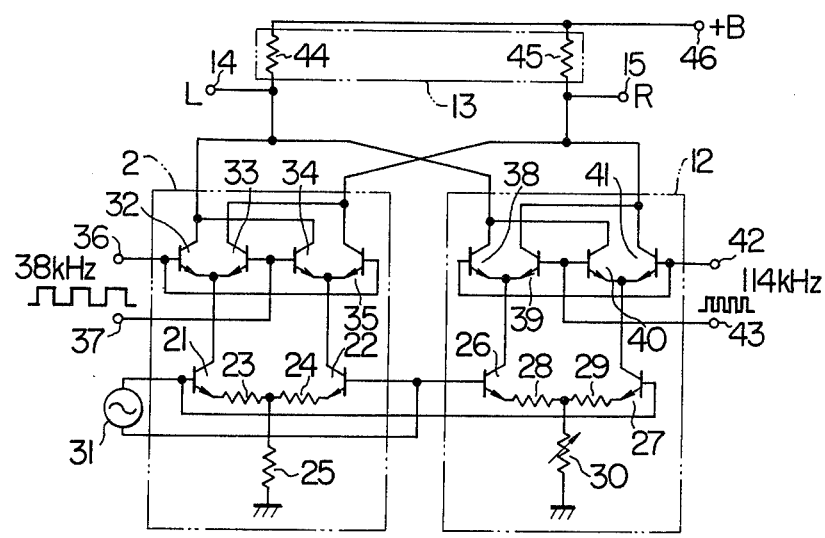
FIG. 2 is a circuit diagram to show details of a switching circuit and an adder embodied in the stereo demodulator circuit according to the invention.

FIG. 2 shows details of circuits of the first and second decoders 2 and 12 and the adder 13 shown in FIG. 1. A pair of transistors 21 and 22 constitute a differential amplifier. The emitter of the transistor 21 is connected to one end of a resistor 23 and the emitter of the transistor 22 is connected to one end of a resistor 24. The other end of the resistor 23 is connected to the other end of the resistor 24 with the junction connected to the earth via a resistor 25. The other pair of transistors 26 and 27 constitute a second differential amplifier with the emitter of the transistor 26 connected to one end of a resistor 28 and the emitter of the transistor 27 connected to one end of a resistor 29. The other ends of the resistors 28 and 29 are mutually connected and the junction is grounded via a variable resistor 30. Reference numeral 31 denotes a composite signal source which is equivalent to the output of the amplifier 1 in FIG. 1. The signal source 31 has one terminal connected to the bases of the transistors 21 and 27 and the other terminal connected to the bases of the transistors 22 and 26. Four transistors 32, 33, 34 and 35 constitute a first switching circuit, the emitters of the switching transistors 32 and 33 being connected in common for connection to the collector of the transistor 21. The emitters of the transistors 34 and 35 are also connected in common for connection to the collector of the transistor 22. A pair of input terminals are provided for receiving the 38 KHz sub-carrier signal, which input terminals are connected to the set of output terminals of the second frequency divider 10 in FIG. 1. While one of the paired input terminals 36 is connected to the bases of the transistors 32 and 35, the other 37 is connected to the bases of the transistors 33 and 34. Four transistors 38, 39, 40 and 41 constitute a second switching circuit, the emitters of the switching transistors 38 and 39 being connected in common for connection to the collector of the transistor 26. The switching transistors 40 and 41 have the emitters connected in common for connection to the collector of the transistor 27. A second pair of input terminals 42 and 43 adapted to receive the 114 KHz switching signal are connected to the set of output terminals of the first frequency divider 8 in FIG. 1. Thus, while the transistors 21 and 22 for the first differential amplifier along with the switching transistors 32, 33, 34 and 35 for the first switching circuit constitute the first decoder 2, the transistors 26 and 27 for the second differential amplifier along with the switching transistors 38, 39, 40 and 41 for the second switching circuit constitute the second decoder 12. The transistors 32 and 34 have the collectors connected in common for connection to a terminal 46 of a power supply as designated by +B via a first load resistor 44 and to a first output terminal 14. The collectors of the transistors 33 and 35 are connected in common for connection to the power supply terminal 46 via a second load resistor 45 and to a second output terminal 15. The collectors of the transistors 38 and 40 are connected in common for connection to the first output terminal 14, and the collectors of the transistors 39 and 41 connected in common are connected to the second output terminal 15. Supplied to the first load resistor 44 are output signals of two transistors 32 and 34 and of the other two transistors 38 and 40 which are added at the load resistor 44. The two load resistors 44 and 45 are loaded on the decoders 2 and 12, respectively, and at the same time constitute the adder 13 for adding the outputs of the two decoders 2 and 12.

In the circuit arrangement as shown in FIG. 2, the composite signal fed from the signal source 31 is supplied to the bases of the transistors 21 and 22 constituting the first differential amplifier and amplified thereby. While the output signal of the transistor 21 on its collector is supplied to the emitters of the paired switching transistors 32 and 33, the output signal of the transistor 22 on its collector is supplied to the emitters of the paired switching transistors 34 and 35. The paired transistors 32 and 33 are repeatedly and alternately turned on and off in response to the sub-carrier signal supplied to the input terminals 36 and 37. Similarly, the other paired transistors 34 and 35 repeat alternate conduction and non-conduction by receiving the sub-carrier signal. The output signal of the transistor 21 is then multiplied by the sub-carrier signal at the paired transistors 32 and 33, and the output signal of the transistor 22 is subjected to the multiplication at the paired transistors 34 and 35. The composite signal from the signal source 31 is also supplied to the bases of the transistors 26 and 27 constituting the second differential amplifier and amplified thereby. While the output signal of the transistor 26 on its collector is supplied to the emitters of the paired switching transistors 38 and 39, the output signal of the transistor 27 on its collector is supplied to the emitters of the other paired switching transistors 40 and 41. The paired transistors 38 and 39 repeat alternate conduction and non-conduction in response to the 114 KHz switching signal supplied to the input terminals 42 and 43. Similarly, the other paired transistors 40 and 41 repeat alternate conduction and non-conduction by receiving the same switching signal. The output signal of the transistor 26 is then multiplied by the switching signal at the transistors 38 and 39, and the output signal of the transistor 27 is multiplied by the switching signal at the transistors 40 and 41.

In the event that the signal source 31 contains, in addition to the composite signal, an unwanted signal such as having a frequency which is three times the frequency of the sub-carrier signal, signals to be supplied to the bases of the transistors 21 and 22 for the first differential amplifier and the transistors 26 and 27 for the second differential amplifier contain, as shown in equation (7), the signal of the tripled frequency, as compared with the sub-carrier signal, and the signal of the nearby frequency. Accordingly, when outputs of the transistors 21 and 22 are multiplied by the sub-carrier signal, outputs of the transistors 32 and 34, for example, contain as shown in equation (8) the beat signal stemming from the third harmonic of the sub-carrier signal and the unwanted signal. On the other hand, since signals to be supplied to the bases of the transistors 26 and 27 contain, as shown in equation (7), the unwanted signal, this unwanted signal is multiplied by the switching signal frequency of triple of the sub-carrier signal frequency at the four transistors 38, 39, 40 and 41 so that outputs of the transistors 38 and 40, for example, contain the unwanted signal which is $X/\pi \cos \omega pt$ in equation (9). The collector of the respective transistors 32 and 34 for the first decoder 2 is connected to the same load resistor 44 as the collector of the respective transistors 38 and 40 for the second decoder 12. Consequently, the outputs of the transistors 32, 34, 38 and 40 are added at the resistor 44 to produce at the output terminal 14 the output signal as shown in equation (10). The paired transistors 26 and 27 for the second differential amplifier have the emitters connected in common to the variable resistor 30 and grounded. Accordingly, gain of the transistors 26 and 27 can be varied by varying resistance of the variable resistor 30 to vary the amplitude of output signals of the four switching transistors 38, 39, 40 and 41. When the gain of the transistors 26 and 27 is so adjusted that the output signal of the transistors 38 and 40 has an amplitude which is $\frac{1}{3}$ of an output signal amplitude of the transistors 32 and 34, the output signal appearing on the output terminal 14 corresponds to a left channel audio signal as shown in equation (11) which is removed of the beat signal.

Similarly, the output signals of the transistors 33 and 35 for the first decoder 2 and the output signals of the transistors 39 and 41 for the second decoder 12 are supplied to the common load resistor 45 and added thereat with elimination of the beat signal.

As described above, even in the event that the unwanted signal of the frequency which corresponds to the odd harmonics of the sub-carrier signal is contained in the signal supplied to the decoder, the beat signal due to this unwanted signal can be eliminated without resort to any filters, thereby improving frequency characteristics of the output signal from the demodulator.

Figure 3:
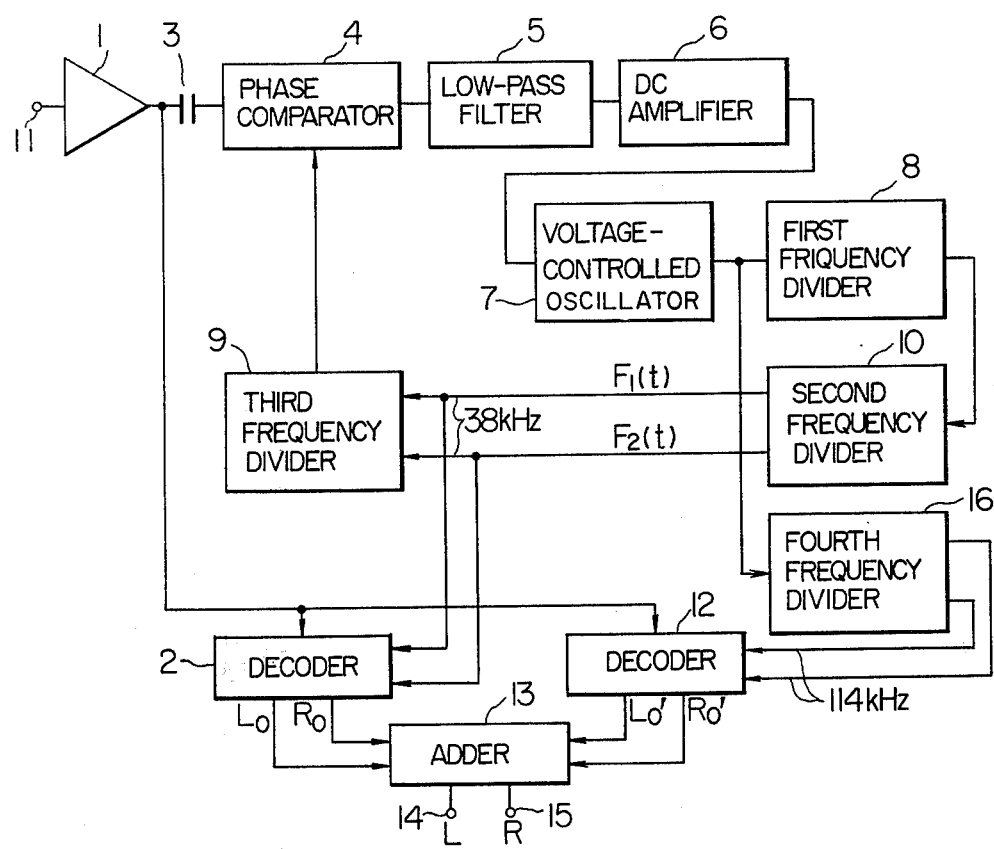
FIG. 3 is a block diagram to show another embodiment of a stereo demodulator circuit according to the invention.

Turning now to FIG. 3, there is shown another embodiment of the stereo demodulator circuit according to this invention. As will be seen from the foregoing description of the first embodiment, the 38 KHz sub-carrier signal supplied to the first decoder 2 and the switching signal supplied to the second decoder 12 are multiplied by the composite signal fed from the amplifier 1 to the first and second decoders 2 and 12. Therefore, it is necessary as in the first embodiment to select the duty ratio of the rectangular wave which is 50% in order to achieve complete separation of the left and right channel signals and to prevent any cross talk. In the circuit of FIG. 1, the output signal of the voltage-controlled oscillator 7 is first frequency divided at the first frequency divider 8 of $\frac{1}{3}$ frequency division ratio and then the output signal of the divider 8 is further divided at the second frequency divider 10 of $\frac{1}{2}$ frequency division ratio to thereby produce the sub-carrier signal components $F_1(t)$ and $F_2(t)$. The frequency divider of $\frac{1}{3}$ frequency division ratio adapted to produce the 50% duty ratio rectangular wave, however, becomes complicated and sophisticated. In a stereo demodulator circuit as shown in FIG. 3, a first frequency divider 8 connected to the output terminal of a voltage-controlled oscillator 7 has a frequency division ratio of $\frac{1}{3}$ so that the output signal frequency of the voltage-controlled oscillator 7 is first converted into 76 KHz frequency which in turn is supplied to a second frequency divider 10. The second frequency divider 10 has a frequency division ratio of $\frac{1}{2}$ and frequency-divides the output signal frequency of the first frequency divider 8 by 2 into 38 KHz frequency which in turn is supplied to a first decoder 2 and a third frequency divider 9. The second frequency divider 10 having $\frac{1}{2}$ frequency division ratio can easily be designed to repeat conduction and non-conduction each time it receives an input pulse to ensure that the input signal frequency to the divider 10 can be divided by 2 to produce the output signal of 50% duty ratio from the divider 10 irrespective of the duty ratio of the input signal. Connected to the output terminal of the voltage-controlled oscillator 7 is a fourth frequency divider 16. The fourth frequency divider 16 having a frequency division ratio of $\frac{1}{2}$ is adapted to frequency-divide the output signal frequency of the voltage-controlled oscillator 7 by 2 and it delivers its output to a second decoder 12. Since the fourth frequency divider 16 also has the $\frac{1}{2}$ frequency division ratio, it is possible to produce the 50% duty ratio output signal from the divider 16 irrespective of the duty ratio of the output signal from the voltage-controlled oscillator 7 so that separation of the left and right output signals of the second decoder 12 can be improved.

As has been described above, this invention can eliminate, without resort to any filters, the unwanted signal which is due to the interference of the difference between the frequency of the desired station and the nearby frequency of another station with the sub-carrier harmonics, in such a manner that frequency characteristics of the demodulated output will not be degraded. This is advantageous in the case of forming a stereo demodulator circuit according to this invention with a semiconductor integrated circuit.

In such a semiconductor integrated circuit that a plurality of circuits are integrated in a single chip and interconnected to each other, a low-pass filter for eliminating an unwanted signal cannot be incorporated into an integrated circuit but is connected to the integrated circuit as external attachment parts, and therefore the number of terminals of the integrated circuit is increased, so that the cost of the integrated circuit is increased undesirably.

In contradistinction to the above, the stereo demodulator circuit according to this invention is not provided with the low-pass filter, so that its entire circuit can be incorporated into a single chip and the number of the external attachment parts can be reduced thereby to simplify the circuit arrangement of a FM stereo receiver set.

Because of the sub-carrier being of a rectangular wave, the third harmonic is particularly mentioned in the foregoing embodiments and the voltage-controlled oscillator is described as having an oscillation frequency of 228 KHz so that the 50% duty ratio of the sub-carrier can be ensured. However, it should be understood that the oscillation frequency is not limited to the above value but may be a frequency of 3 N (N being integer) multiple of the sub-carrier frequency from which the 38 KHz sub-carrier and the triple of sub-carrier, i.e., 114 KHz can be derived by using the first frequency divider 8.

It should also be understood that teachings of the invention may be applicable to elimination of an unwanted spectrum near higher harmonics than the third harmonic, although the foregoing embodiments are described by way of the unwanted spectrum near the third harmonic.

What is claimed is:
1. A stereo demodulator circuit comprising:
   a voltage-controlled oscillator for generating a signal having a frequency which is N times (N being an integer not less than 3) the frequency of a sub-carrier in synchronism with the phase of a pilot signal contained in a composite signal;

a first frequency divider supplied with an output signal from said voltage-controlled oscillator and dividing by N the frequency of the output signal from said voltage-controlled oscillator for producing a first switching signal having the same frequency as said sub-carrier frequency;

a second frequency divider supplied with an output signal from said voltage-controlled oscillator and dividing the frequency of the output signal from said voltage-controlled oscillator for producing a second switching signal having a frequency which is 3 times the frequency of said sub-carrier;

a first circuit means supplied with said composite signal for producing a first output signal;

a second circuit means supplied with said composite signal for producing a second output signal which is one-third the amplitude of the first output signal from said first circuit means;

a first switching circuit supplied with said first switching signal and the first output signal of said first circuit means for separating a left and a right channel signal from said composite signal;

a second switching circuit supplied with said second switching signal and the second output signal of said second circuit means for separating a left and a right channel signal from said composite signal;

a first adder for adding the left channel output signal of said first switching circuit to the left channel output signal of said second switching circuit; and a second adder for adding the right channel output signal of said first switching circuit to the right channel output signal of said second switching circuit.

2. A stereo demodulator circuit according to claim 1, wherein said first and second circuit means respectively comprise first and second differential amplifiers, said second differential amplifier having an amplification degree which is one-third the amplification degree of said first differential amplifier.

3. A stereo demodulator circuit according to claim 2, wherein said first switching circuit comprises: a first and a second transistor connected in common to a first input terminal at their respective bases; a third and a fourth transistor connected in common to a second input terminal at their respective bases; means for supplying said first switching signal to said first and second input terminals in a manner so that the respective inputs at said first and second terminals are opposite in phase to each other; means for connecting, allowing d.c. conduction, the output terminals of said first differential amplifier to the emitter electrodes, respectively, at which said first and third transistors are connected to each other and said second and fourth transistors are connected to each other; a first output terminal connected to the collector electrodes of said first and fourth transistors; and a second terminal connected to the collector of said second and third transistors, wherein said second switching circuit comprises: a fifth and a sixth transistor connected in common to a third input terminal at their bases; a seventh and an eighth transistor connected in common to a fourth input terminal at their bases; means for supplying said second switching signal to said third and fourth input terminals in a manner so that the respective inputs at said third and fourth input terminals are opposite in phase to each other; means for connecting, allowing d.c. conduction, the output terminals of said second differential amplifier to the emitter electrodes, respectively, at which said fifth and seventh transistors are connected to each other and said sixth and eighth transistors are connected to each other; means for connecting the respective collector electrodes of said sixth and eighth transistors to said first output terminal; means for connecting the respective collector electrodes of said fifth and eighth transistors to said second output terminal, and wherein said first adder comprises a first resistor connected between said first output terminal and a power source and said second adder comprises a second resistor connected between said second output terminal and the power source.

4. A stereo demodulator circuit according to claim 1, 2 or 3, wherein the first frequency divider is coupled to the output of the second frequency divider so that said first frequency divider is supplied with the output of said voltage-controlled oscillator after voltage-controlled oscillator's output signal has passed through the second frequency divider and has been converted into the second switching signal having a frequency which is 3 times the frequency of said sub-carrier, said first frequency divider dividing the output of the second frequency divider by 3 to produce the first switching signal having the same frequency as the sub-carrier.

* * * * *